United States Patent
Tessier et al.

(10) Patent No.: US 9,330,733 B1
(45) Date of Patent: *May 3, 2016

(54) POWER-AWARE RAM PROCESSING

(75) Inventors: Russell George Tessier, Sunderland, MA (US); Vaughn Timothy Betz, Toronto (CA); Thiagaraja Golpalsamy, San Jose, CA (US); David Neto, Toronto (CA)

(73) Assignee: Altera Corporation, San Jose, CA (US)

(*) Notice: Subject to any disclaimer, the term of this patent is extended or adjusted under 35 U.S.C. 154(b) by 268 days.

This patent is subject to a terminal disclaimer.

(21) Appl. No.: 13/012,717

(22) Filed: Jan. 24, 2011

Related U.S. Application Data

(63) Continuation of application No. 11/510,018, filed on Aug. 24, 2006, now Pat. No. 7,877,555.

(60) Provisional application No. 60/719,251, filed on Sep. 20, 2005.

(51) Int. Cl.
*G06F 12/00* (2006.01)
*G11C 5/14* (2006.01)

(52) U.S. Cl.
CPC .......... *G11C 5/14* (2013.01); *G11C 2207/2227* (2013.01)

(58) Field of Classification Search
CPC .............. G06F 1/3237; G06F 17/5054; G06F 2217/78; G06F 17/5022; G06F 17/5036; G06F 17/30147; G06F 3/0625; G11C 2207/2227; G11C 5/14; G11C 7/22; G11C 8/12
USPC .......................................... 711/203; 716/109
See application file for complete search history.

(56) References Cited

U.S. PATENT DOCUMENTS

| | | | | |
|---|---|---|---|---|
| 5,309,395 | A * | 5/1994 | Dickinson et al. | 365/189.04 |
| 5,553,002 | A * | 9/1996 | Dangelo et al. | 716/102 |
| 6,038,381 | A * | 3/2000 | Munch et al. | 716/104 |
| 6,072,348 | A | 6/2000 | New et al. | |
| 6,112,023 | A * | 8/2000 | Dave et al. | 703/27 |
| 6,564,331 | B1 * | 5/2003 | Joshi | 713/324 |
| 6,848,058 | B1 * | 1/2005 | Sinclair et al. | 713/322 |
| 6,871,328 | B1 | 3/2005 | Fung et al. | |
| 6,954,837 | B2 | 10/2005 | Woo et al. | |
| 6,968,514 | B2 * | 11/2005 | Cooke et al. | 716/102 |
| 7,098,689 | B1 * | 8/2006 | Tuan et al. | 326/44 |

(Continued)

FOREIGN PATENT DOCUMENTS

EP 633518 A1 * 1/1995

*Primary Examiner* — Yaima Rigol

(57) ABSTRACT

Logical memories and other logic functions specified in designs are mapped to power-optimized implementations using physical memories and other device resources. A logical memory may be automatically mapped to numerous potential physical implementations. Power consumption is estimated for each potential physical implementation to select the physical implementation providing the best performance with respect to power consumption and any other design constraints. Potential physical implementations can suppress clock transitions via clock enable inputs when embedded memory is not accessed. Read-enable and write-enable signals can be converted to functionally equivalent clock enable signals. Clock enable signals can be created to deactivate unused memory access ports and to deactivate embedded memory blocks during don't-care conditions. Potential physical implementations can slice logical memory into two or more embedded memory blocks to minimize power consumption.

21 Claims, 11 Drawing Sheets

(56) References Cited

U.S. PATENT DOCUMENTS

| | | |
|---|---|---|
| 7,233,810 B2 | 6/2007 | Medlock et al. |
| 7,243,312 B1 | 7/2007 | Lysaght et al. |
| 7,284,138 B2 * | 10/2007 | Riley et al. .................... 713/322 |
| 7,337,422 B1 * | 2/2008 | Becker et al. ................. 716/121 |
| 7,437,584 B2 | 10/2008 | Kao |
| 2007/0005324 A1 * | 1/2007 | Gong et al. ......... G06F 17/5036 703/14 |
| 2008/0204072 A1 | 8/2008 | Sasao et al. |

\* cited by examiner

POWER-AWARE RAM PROCESSING

CROSS-REFERENCES TO RELATED APPLICATIONS

This application is a continuation of, and claims the benefit of and priority to, U.S. patent application Ser. No. 11/510,018, filed Aug. 24, 2006 (currently pending), which claims the benefit of and priority to U.S. Provisional Patent Application No. 60/719,251, filed Sep. 20, 2005, each of which is incorporated herein by reference in its respective entirety.

BACKGROUND OF THE INVENTION

The present invention relates to the field of programmable devices, and the systems and methods for programming the same. Programmable devices, such as FPGAs, typically includes thousands of programmable logic cells that use combinations of logic gates and/or look-up tables to perform a logic operation. Programmable devices also include a number of functional blocks having specialized logic devices adapted to specific logic operations, such as adders, multiply and accumulate circuits, phase-locked loops, and one or more embedded memory array blocks. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

Embedded memory blocks are important components in programmable devices. Embedded memory blocks allow for bulk data storage within the device without the need for time-consuming off-device memory accesses. As a result of their extensive use, memory blocks often consume a substantial part of programmable devices' silicon area and between 10 and 20% of core dynamic power consumption in the average design, and a much higher proportion in some designs. Current programmable devices' embedded memory blocks are synchronous and primarily consume power due to internal memory core operations activated by the clock.

Typical programmable devices include a large number of embedded memory units of one or more fixed sizes. Additionally, these embedded memory units can have fixed configurations, including input and output data widths and memory depths, or variable configurations, including variable input and output data widths and memory depths.

To provide flexibility for programmable device designs, many design software applications enable designers to specify logical memory blocks of arbitrary size, input and output data widths, and other aspects. The design software application translates the desired logical memory block into a configuration of one or more embedded memory blocks. This corresponding configuration of embedded memory blocks, referred to as a physical memory, includes the configuration of the data widths and input, output, address, and control connections of each of its embedded memory blocks such that the behavior of the physical memory is identical to that of the specified logical memory. The physical memory can also include logic functions, such as logic gates, multiplexers, and demultiplexers, as needed to emulate the behavior of a specified logical memory. The translation of logical memories into corresponding sets of one or more embedded memory blocks and optional associated logic functions is performed by a series of mapping steps.

Design software applications can enable physical memories, that is sets of one or more embedded memory blocks and optional associated logic functions, to implement a wide variety of designer specified logical memories. Additionally, other logic functions can be implemented as physical memories, including shift registers, counters, and buffers such as FIFOs and LIFOs. Alternatively, these other logic functions can be implemented without embedded memory blocks by using only the programmable logic resources of the programmable device.

Currently, designers must optimize logical and physical memories for reduced power consumption manually. This optimization process is time-consuming and the designer must have extensive power-optimization experience and detailed knowledge of the underlying architecture of the programmable device. Additionally, this manual optimization process can be error-prone and the designers must be careful not to violate timing, area, and other design constraints when optimizing logical and physical memories for reduced power consumption.

It is therefore desirable for design software applications to automatically optimize the mapping of logical memories to physical memories for reduced power consumption. It is further desirable for design software application to optimize logic functions for reduced power consumption using physical memories such as embedded memory blocks or programmable logic resources. It is also desirable that the design software applications automatically optimize logical memories and other logic function for reduced power consumption without violating timing, area, or other constraints of the design.

BRIEF SUMMARY OF THE INVENTION

An embodiment of the invention maps logical memories and other logic functions specified in designs to power-optimized implementations using physical memories and other device resources. An embodiment of the invention automatically maps a logical memory to numerous potential physical implementations. Power consumption is estimated for each potential physical implementation and an embodiment of the invention selects the physical implementation providing the best performance with respect to power consumption and any other design constraints. Potential physical implementations can suppress clock transitions via clock enable inputs when embedded memory is not accessed. Read-enable and write-enable signals can be converted to functionally equivalent clock enable signals. Clock enable signals can be created to deactivate unused memory access ports and to deactivate embedded memory blocks during don't-care conditions. Potential physical implementations can slice logical memory into two or more embedded memory blocks to minimize power consumption.

In an embodiment, a method of mapping a logical element of a design to a physical memory configuration includes determining at least two potential mappings of the logical element to a physical memory configuration. The power consumption of each potential mapping is evaluated and the potential mappings are ranked according to power consumption. One of the potential mappings having the lowest power consumption is selected and checked against at least one design constraint. The selected potential mapping is packed into at least one embedded memory block included in the physical memory configuration if the selected potential mapping satisfies the design constraint. Alternatively, a different one of the potential mappings is selected if the selected potential mapping does not satisfy the design constraint.

In an embodiment, the logical element can be a logical memory or a logic function converted to a logical memory. In a further embodiment, the logic function can include a shift register, a counter, or a buffer.

In another embodiment, evaluating the power consumption of each potential mapping includes determining for each potential mapping a number of embedded memory blocks; a number of active access ports associated with each embedded memory block; and an amount of associated logic circuits. The associated logic circuits may include an address decoding logic circuit and/or an output multiplexer.

In a further embodiment, at least one potential mapping may include an access port of an embedded memory block deactivated using a clock enable signal. In another embodiment, at least one potential mapping may include a read enable signal of the logical element assigned to a functionally equivalent clock enable signal of an embedded memory block. In still another embodiment, at least one potential mapping may include a write enable signal of the logical element assigned to a functionally equivalent clock enable signal of an embedded memory block. In yet another embodiment, at least one potential mapping may include a slicing of the logical element into a plurality of embedded memory blocks, such that the sum of the dynamic power consumption of the plurality of embedded memory blocks and any associated logic circuits is minimized.

In an additional embodiment, determining at least two potential mappings of the logical element to a physical memory configuration includes analyzing the logical element to determine at least one power optimization to the physical memory configuration. The power optimization may include selectively disabling at least one clock enable input of at least one embedded memory block of the physical memory configuration to reduce dynamic power consumption of the physical memory configuration. In a further embodiment, analyzing the logical element to determine at least one power optimization includes determining a don't-care condition associated with an output of the logical element and creating a don't-care signal corresponding with the don't care condition. The don't-care signal is connected with the clock-enable input of the embedded memory block of the physical memory configuration.

An embodiment can use memory blocks with dedicated clock enable inputs or can add logic circuits to the clock inputs of memory blocks as needed to create clock enable inputs. A further embodiment can implement the added logic circuits using programmable device resources. An additional embodiment can use dedicated memory blocks of the programmable device alone or in conjunction with dual-use blocks of a device (if available) configured to operate as memory blocks.

BRIEF DESCRIPTION OF THE DRAWINGS

The invention will be described with reference to the drawings, in which.

DETAILED DESCRIPTION OF THE INVENTION

Figure 1:
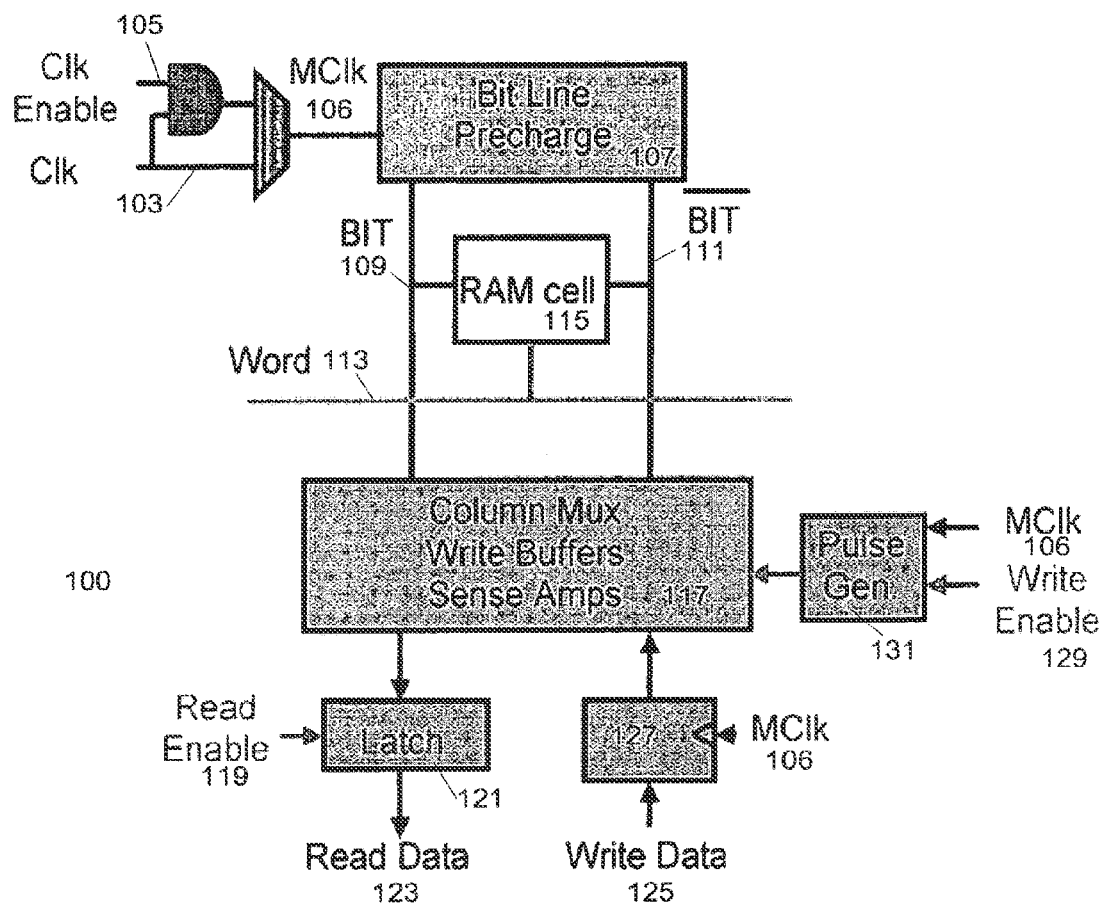
FIG. 1 illustrates an example embedded memory of a programmable device suitable for use with the optimization techniques of embodiments of the invention.

FIG. 1 illustrates an example embedded memory 100 of a programmable device suitable for use with the optimization techniques of embodiments of the invention. FIG. 1 illustrates a single access port for reading and writing data to embedded memory 100. Other implementations of embedded memory 100 can have multiple access ports, similar to that shown in FIG. 1, enabling read and/or write access to the embedded memory 100.

Embedded memory 100 receives a clock signal via a clock signal input 103 from another portion of the programmable device. As discussed in detail below, the operation of the programmable device is directed by control signals and the clock signal. In this implementation, the clock signal input 103 is gated with a clock enable signal provided via a clock enable input 105 to produce a memory clock signal 106. The clock enable signal input 103 can be used to selectively deactivate the memory clock signal 106, thereby deactivating the entire embedded memory block 100 and reducing power consumption. In some embodiments, the clock enable input 105 and associated logic gates used to selectively deactivate the memory clock signal 106 are included as dedicated logic circuits in the embedded memory block. In other embodiments, the clock enable input 105 and associated logic gates are implemented outside of the embedded memory 100 using dedicated or programmable logic circuits of the programmable device.

In an embodiment, the memory clock signal 106 is provided to a bit line precharge unit 107. Bit line precharge unit 107 is adapted to charge one or more pairs of bit lines to a voltage level suitable for performing a read or write operation. For clarity, FIG. 1 illustrates a single pair of bit lines, 109 and 111, a single word line 113, and a single memory cell 115. However, typical embedded memory units include a large number of memory cells arranged in rows and columns of a memory array. Each row of the memory array includes a word line and each column of the memory array includes a pair of bit lines.

The pair of bit lines 109 and 111 connect memory cell 115 with read and write circuits 117. Read and write circuits 117 include column multiplexers, write buffers, and sense amplifiers. Memory cell 115 and read and write circuits 117 can be similar to any type of memory circuit known in the art, including static random access memory (SRAM).

The internal operation of embedded memory 100 during read and write operations illustrates the causes of dynamic power dissipation. In a typical memory read operation, the memory clock signal 106 is strobed, which causes the bit line precharge unit 107 to charge the bit lines 109 and 111. Address input signals are decoded by an address decoder unit, not shown, to activate a word line 113, which selectively connects one or more memory cells, such as memory cell 115, to bit lines 109 and 111.

Selected memory cell 115 introduces a voltage difference between bit lines 109 and 111 that corresponds to the state of the memory cell 115. Depending upon the type of memory technology employed, this voltage difference between bit lines may be due to the state of the memory cell controlling transistors such that one of the bit lines 109 or 111 has its voltage pulled down, due to charge stored in the memory cell 115, or due to any other property associated with any type of memory technology known to one of ordinary skill in the art. This voltage difference between bit lines 109 and 111 is detected by the sense amplifiers within read and write circuits 117, which in turn passes a data signal corresponding with the state of memory cell 115 to read latch 121. In response to a read enable signal received via read enable input 119, read latch 121 stores the data signal corresponding with the state of the memory cell 115. The contents of the read latch 121 can be accessed via read data 123.

Similarly, in a typical memory write operation, the memory clock signal 106 is strobed, which causes the bit line precharge unit 107 to charge the bit lines 109 and 111. Address input signals are decoded by an address decoder unit, not shown, to activate a word line 113, which selectively connects memory cell 115 to bit lines 109 and 111.

A write enable signal is received via write enable input 129 of pulse generator 131. Write data is received via write data input 125 of write data latch 127. The pulse generator 131 facilitates the transfer of write data from write data latch 127 to write buffers in read and write circuits 117. Write data from the write buffers is then stored in the appropriate memory cells, such as memory cell 115. Typically, additional memory cells also connected with word line 113 and omitted for clarity can be written in parallel with memory cell 115.

For both read and write operations, a substantial portion of the total dynamic power consumption is from the bit line precharge unit 107. Additional dynamic power is consumed by the word line decoding, memory cell access, the pulse generator 131, and the write data latch 127. In the embedded memory block 100, the pulse generator 131, the write data latch 127, and the bit line precharge unit 107 are controlled by memory clock signal 106. When the memory clock signal 106 is suppressed by the clock enable signal of clock enable input 105, these components are deactivated and do not consume any significant dynamic power.

Thus, one approach to reducing dynamic power consumption in embedded memory blocks is suppress the memory clock signal 106 as often as possible without changing the logical functions of the memory. An embodiment of the invention automatically translates a logical memory or other logic function into a functionally equivalent configuration of one or more physical memories, such as embedded memory blocks, and supporting logic. To reduce power consumption, the embodiment of the invention creates a functionally equivalent translation that suppresses the memory clock signal 106 of one or more memory access ports for one or more physical memories as often as possible without changing the function of the memory and without violating area, timing, or other design constraints.

Figure 2:
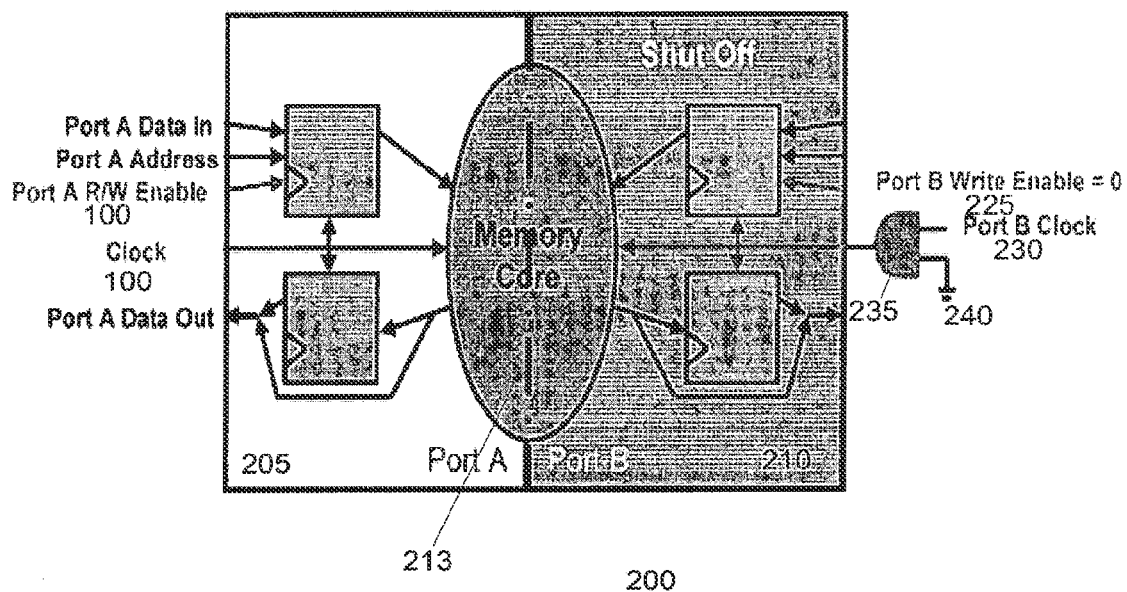
FIG. 2 illustrates the application of a first type of memory optimization suitable for use with an embodiment of the invention.

An embodiment of the invention uses a number of different algorithmic approaches to produce a power-optimized mapping of logical memories into physical memories. A first algorithmic approach is to disable unused memory access ports of physical memories used to implement a logical memory. FIG. 2 illustrates the application of a first type of memory optimization suitable for use with an embodiment of the invention.

A physical memory 200, such as an embedded memory block, can include two or more memory access ports. For example, physical memory 200 includes memory access ports 205 and 210. Each memory access port is capable of accessing a memory core 213, which includes an array of memory cells adapted to retrieve and store data. In some implementations, the components and functions of each memory access port are similar to that described with reference to FIG. 1. Other implementations of the memory access ports are possible using any type of electronic or other memory device known to those of skill in the art.

The operation of each memory access port is directed by control signals including a clock signal and a read/write enable signal. Memory access ports 205 and 210 can have separate clock signals and read/write enable signals. For example, memory access port 205 includes a read/write enable input 215 and a clock input 220. Similarly, memory access port 210 includes a read/write enable input 225 and a clock input 230.

If a physical memory configuration does not require the use of one or more memory access ports, an embodiment of the invention optimizes the physical memory configuration by disabling the clock signals for unused memory access ports, thereby deactivating the memory access port. For example, memory access port 210 can be disabled by setting the clock signal input 230 to ground.

For some types of memory blocks, the memory access port can include a dedicated clock enable input. A control signal applied to the clock enable input can selectively enable or disable the clock signal provided to the memory access port. If a memory block lacks a dedicated clock enable input, this functionality can be added with the addition of a logic gate, such as an AND gate, to the clock input of the memory access port. For programmable devices, this logic gate can be implemented using the programmable logic resources of the programmable device, such as a logic cell.

Figure 3A:
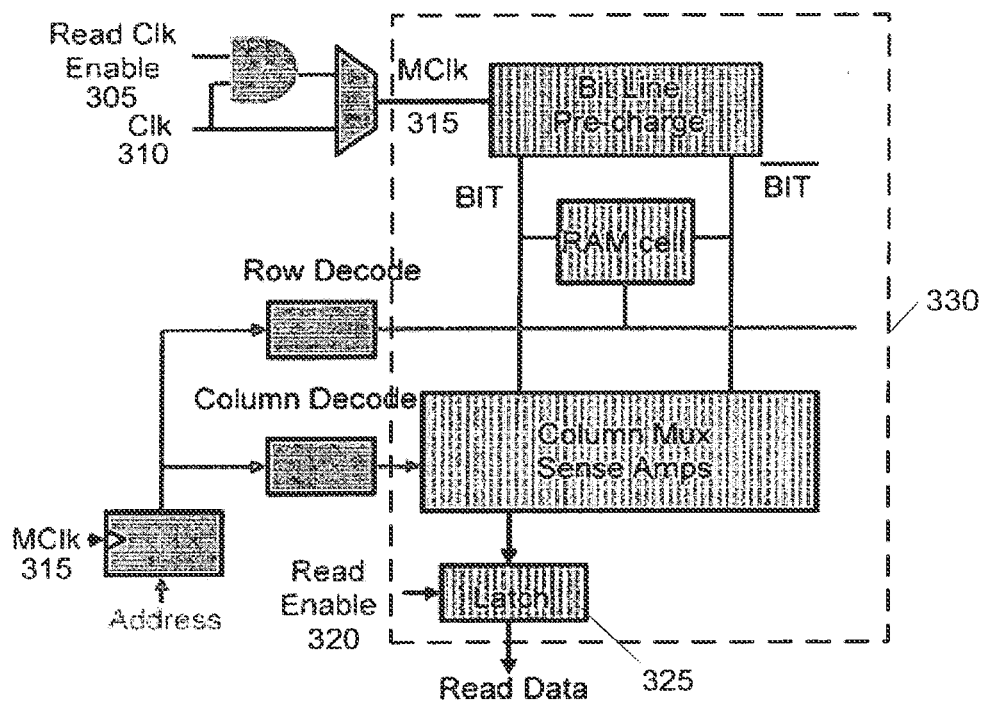
FIGS. 3A-3B illustrate applications of a second type of memory optimization suitable for use with an embodiment of the invention.
Figure 3B:
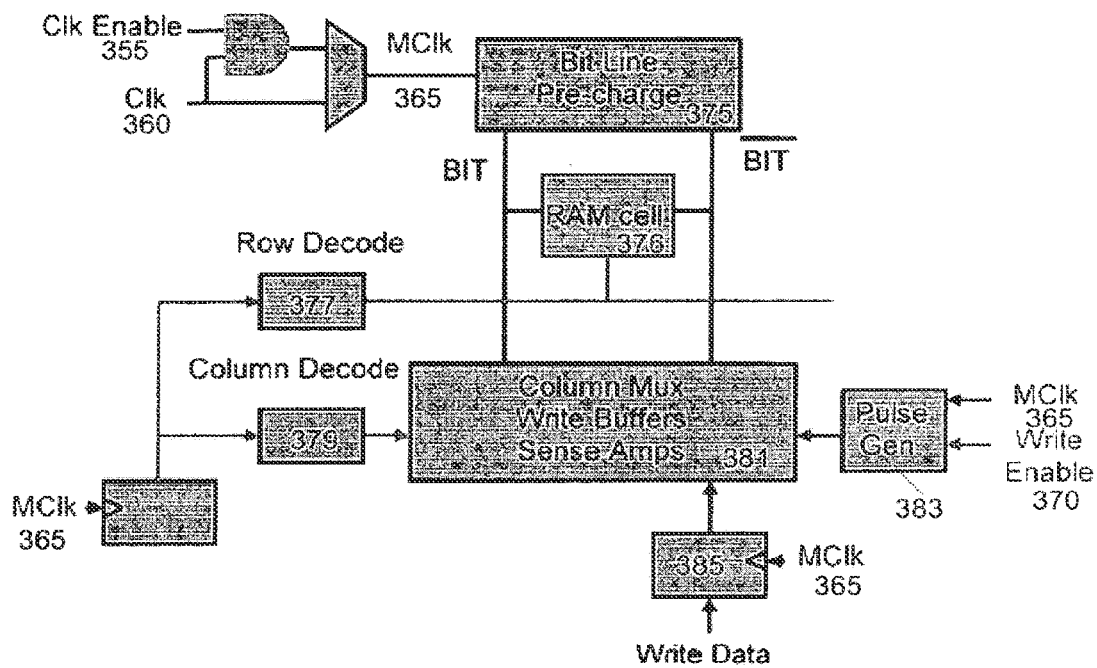

An embodiment of the invention can apply this type of optimization to memory access ports of physical memories that are never used in the implementation of a logical memory. In some other physical memory configurations, a memory access port may be used occasionally in the implementation of a logical memory. For these physical memory configurations, a second algorithmic approach selectively deactivates memory access ports that are not in use, while allowing for read and/or write access as needed. FIGS. 3A-B illustrate applications of a second type of memory optimization according to an embodiment of the invention.

FIG. 3A illustrates an application of a memory optimization that selectively deactivates a memory access port 300 while allowing for read access as needed. Typically, read access of memory access port 300 is facilitated by a read enable signal received by a read enable input 320. Additionally, memory access port 300 receives a clock signal 310 and a read clock enable signal 305. The clock signal 310 is gated with read clock enable signal 305 to produce a memory clock signal 315. The memory clock signal 315 is suppressed when the read clock enable signal 305 is deasserted.

When the memory clock signal 315 is suppressed, the set of components 330 of memory access port 300 will be deactivated. The set of components 330 includes the bit line precharge unit, memory cells, column multiplexers, sense amplifiers, and read data latch. Thus, suppressing the memory clock signal 315 using the read clock enable signal 305 can substantially reduce power consumption when the memory access port is unused.

In contrast, the read enable signal 320 of memory access port 300 controls access to read data latch 325. If a read operation is performed when the read enable signal 320 is deasserted, new data will not be stored in the read data latch 325 and will be discarded. However, there will still be substantial power consumption due to the operation of the bit line precharge unit, column multiplexers, and sense amplifiers.

To reduce power consumption, a second type of memory optimization substitutes the read enable signal provided to read enable input 320 with an equivalent read clock enable signal 305. This allows a substantial portion of the components of the memory access port to be deactivated when the read enable signal is deasserted. To facilitate the determination of when a read clock enable signal is equivalent to the read enable signal, Table 1 illustrates the operation of the memory access port 300 in response to the read enable signal 320 and the read clock enable signal 305.

TABLE 1

Memory Access Port Behavior in Response to Read Enable and Read Clock Enable

| Read Clock Enable | Read Enable | Memory Access Port Behavior |
| --- | --- | --- |
| 0 | 0 | Read data latch closed; Memory access port disabled |
| 1 | 0 | Read data latch closed; Memory access port enabled |
| 0 | 1 | Read data latch open; Memory access port disabled |
| 1 | 1 | Read data latch open; Memory access port enabled; Read occurs |

As can be seen from Table 1, the memory access port successfully reads data only when the logical AND of the read clock enable signal and the read enable is true. Thus, the read enable input 320 can be set to a logical 1 and the read enable signal can connected with the read clock enable input 305. This configuration will be functionally equivalent to the expected operation of the memory access port 300 in response to the read enable signal with the additional advantage of reduced power consumption due to the suppression of the memory clock signal 315 when the read enable signal is deasserted.

Similarly, FIG. 3B illustrates an application of a memory optimization that selectively deactivates a memory access port 350 while allowing for write access as needed. Typically, write access of memory access port 350 is facilitated by a write enable signal received by a write enable input 370. Additionally, memory access port 350 receives a clock signal 360 and a write clock enable signal 355. The write clock enable signal 355 is gated with the clock signal 360 to produce a memory clock signal 365. The memory clock signal 365 is suppressed when the write clock enable signal 355 is deasserted.

When the memory clock signal 365 is suppressed, the bit line precharge unit 375; memory cells 376; column multiplexers, write buffers, and sense amplifiers 381; row and column decoders 377 and 379; pulse generator 383; and write data latch 385 will all be deactivated. Thus, suppressing the memory clock signal 365 using the write clock enable signal 355 can substantially reduce power consumption when the memory access port is unused.

In contrast, the write enable signal input 370 of memory access port 350 controls the pulse generator 383. However, the write enable signal input 370 does not deactivate components such as the bit line precharge unit 375; row and column decoders 377 and 379; and the write data latch 385. Thus, the memory access port 350 will still consume substantial amounts of power even when the write enable signal input 370 is deasserted.

To reduce power consumption, a second type of memory optimization substitutes the write enable signal provided to write enable input 370 with an equivalent write clock enable signal 355. This allows a substantial portion of the components of the memory access port to be deactivated when the write enable signal is deasserted. To facilitate the determination of when a write clock enable signal is equivalent to the write enable signal, Table 2 illustrates the operation of the memory access port 350 in response to the write enable signal input 370 and the write clock enable signal 355.

TABLE 2

Memory Access Port Behavior in Response to Write Enable and Write Clock Enable

| Write Clock Enable | Write Enable | Memory Access Port Behavior |
| --- | --- | --- |
| 0 | 0 | Pulse generator deactivated; Memory access port disabled |
| 1 | 0 | Pulse generator deactivated; Memory access port enabled |
| 0 | 1 | Pulse generator activated; Memory access port disabled |
| 1 | 1 | Pulse generator activated; Memory access port enabled; Write occurs |

As can be seen from Table 2, the memory access port 350 successfully writes data only when the logical AND of the write clock enable signal and the write enable is true. Thus, the write enable input 370 can be set to a logical 1 and the write enable signal can be connected with the write clock enable input 355. This configuration will be functionally equivalent to the expected operation of the memory access port 350 in response to the write enable signal with the additional advantage of reduced power consumption due to the suppression of the memory clock signal 365 when the write enable signal is deasserted.

In some applications, memory access ports of a physical memory often support simultaneous and independent read and write operations. If the memory access ports include independent clock signals and clock enable inputs, the approaches of FIGS. 3A and 3B can be easily combined. If there is only a single clock signal, additional logic elements within the physical memory or located elsewhere in the programmable device can be used to logically split the clock signal into two clock signals, one for each memory access port. The above approaches can then be applied to the separate clock signals of each memory port.

In further applications, a user design may already specify the function of the clock enable signal for a memory access port. In these applications, an AND logic gate can be used to combine the read and/or write enable signal with the user-specified clock enable signal. The combined clock enable signal is connected with the memory access port clock enable signal as discussed above. Embodiments of the invention consider timing, area, and other effects when adding additional logic to a physical memory implementation of a logical memory to ensure that design constraints are not violated.

In some applications, the logical memory specified by a design is larger than the capacity of a single physical memory of the programmable device. As discussed above, embodiments of the invention may automatically translate a logical memory or other logic function into a functionally equivalent configuration of multiple physical memories and supporting logic. A third optimization approach reduces power consumption for configurations of multiple physical memories by allowing at least one physical memory to remain inactive during memory accesses.

Figure 4A:
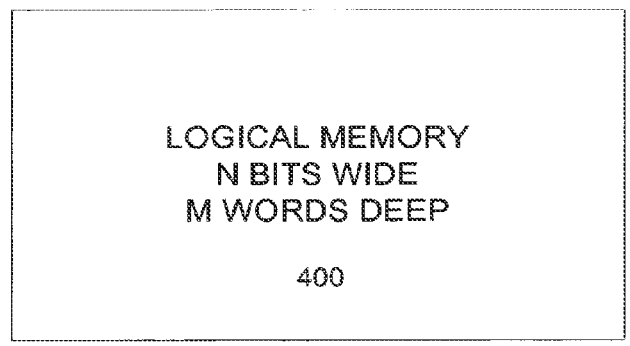
FIGS. 4A-4C illustrate a logical memory and corresponding physical memory implementations suitable for use with an embodiment of the invention.
Figure 4B:
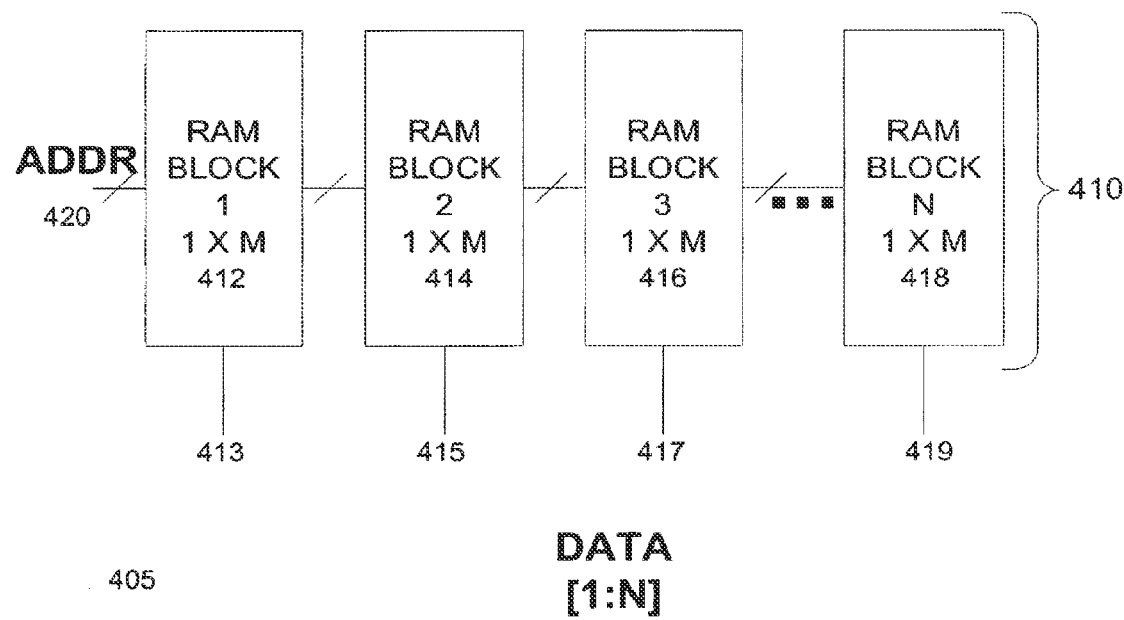
Figure 4C:
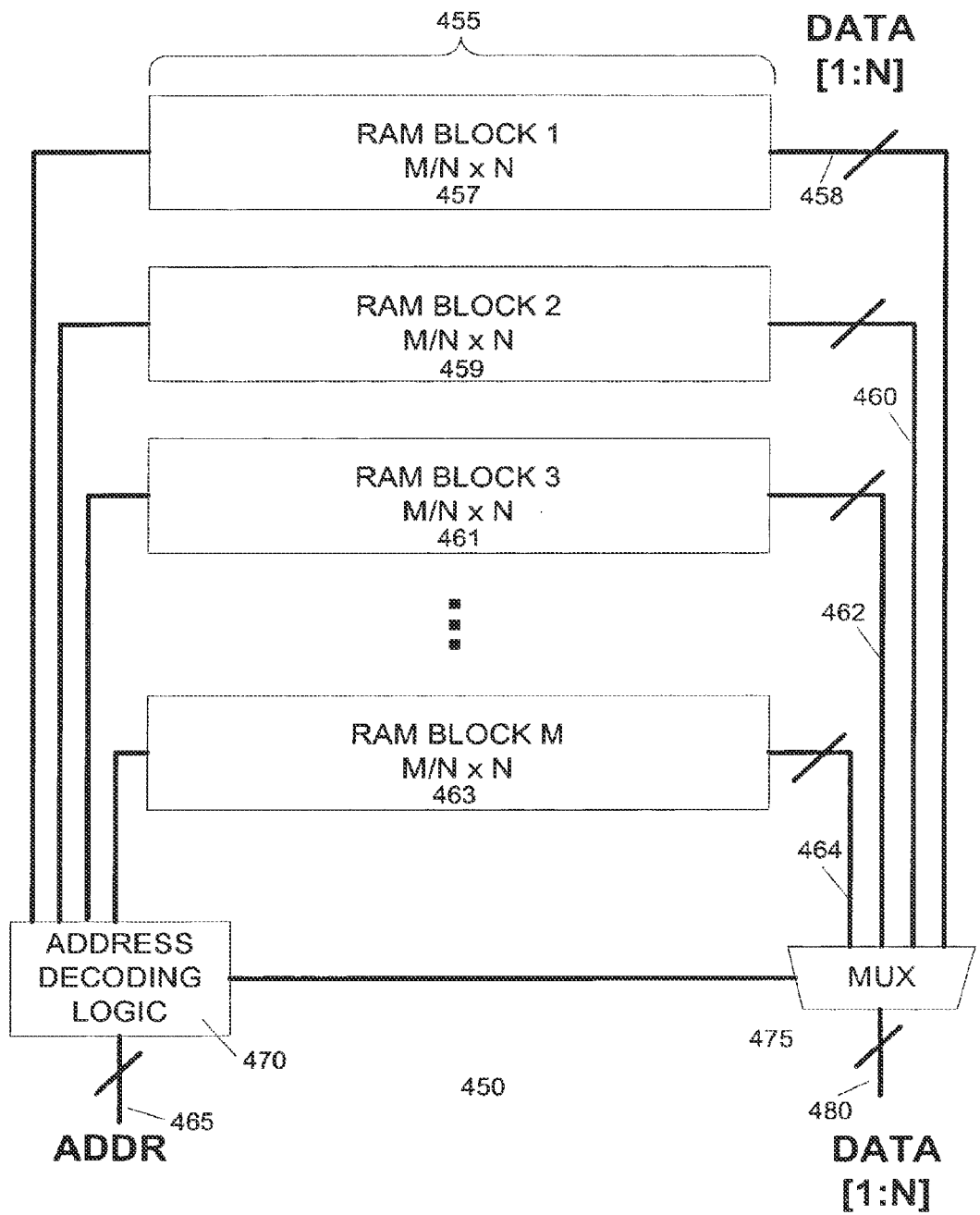

FIGS. 4A-4C illustrate a logical memory and corresponding physical memory implementations suitable for use with an embodiment of the invention. FIG. 4A illustrates an example logical memory 400. Logical memory 400 is specified to have an arbitrary width of N bits and an arbitrary depth of M words, wherein each word is a group of N bits.

FIG. 4B illustrates a first physical memory 405 implementing the logical memory 400. Physical memory 405 includes a set of N memory blocks 410, such as memory blocks 412, 414, 416, and 418. Each of the N memory blocks has a data width of 1 and a depth of at least M. Thus, physical memory 405 includes a total of M×N bits, as specified by logical memory 400. Physical memory 405 is sometimes referred to as a vertical memory slicing configuration.

A set of address lines 420 are connected in parallel to each memory block in set 410. Each memory block of set 410 includes a 1-bit output, such as outputs 413, 415, 417, and 419. When physical memory 405 is accessed, each of the memory blocks outputs one of the bits of a N-bit memory word. Although physical memory 405 does not require any supporting logic, which reduces area and timing requirements, each memory block in set 410 must be active during every memory access. Thus, physical memory 405 consumes a substantial amount of power.

FIG. 4C illustrates a second physical memory 450 implementing the logical memory 400. Physical memory 450 includes a set of M memory blocks 455, such as memory blocks 457, 459, 461, and 463. Each memory block of set 455 has a data width of N and a depth of at least 1. In this example, each memory block has a depth of M/N, giving each memory block a capacity of M bits. Thus, physical memory 450 includes a total of M×N bits, as specified by logical memory 400. Physical memory 450 is sometimes referred to as a horizontal memory slicing configuration.

A set of address lines 465 are connected with address decoding logic 470. Address decoding logic 470 is connected with each of the memory blocks of set 455. Address decoding logic 470 is adapted to selectively activate one of the set of memory blocks 455 in response to a memory address. Each of the memory blocks of set 455 includes a N-bit data output, such as data outputs 458, 460, 462, and 464. The data outputs are connected with output multiplexer 475. Output multiplexer 475 is controlled by address decoding logic 470 and adapted to selectively connect one of the N-bit memory block data outputs to an N-bit physical memory data output 480.

When physical memory 450 is accessed, the address decoding logic 470 selectively activates one of the memory blocks of set 455. The remaining memory blocks in set 455 are not used and may be deactivated to conserve power. Memory blocks may be deactivated by suppressing the memory clock signal using read or write enable signals, as described above. Physical memory 450 consumes substantially less power than physical memory 405. However, the addition of address decoding logic 470 and multiplexer 475 increases the timing and area requirements. Additionally, address decoding logic 470 and multiplexer 475 consume some power as well.

Physical memories 405 and 450 represent two end points in a range of physical memory configurations corresponding with logical memory 400. For example, each of the memory blocks in physical memory 405 can be increased in width, thereby reducing the total number of memory blocks that are active simultaneously. Similarly, the depth of each memory block in physical memory 450 can be increased, reducing the complexity of address decoding logic 470 and multiplexer 475, and in some cases reducing the total number of memory blocks in set 455 as well. For many applications, an intermediate physical memory configuration, incorporating some aspects of physical memories 405 and 450 will be optimal for power consumption, area, and timing constraints.

Figure 5:
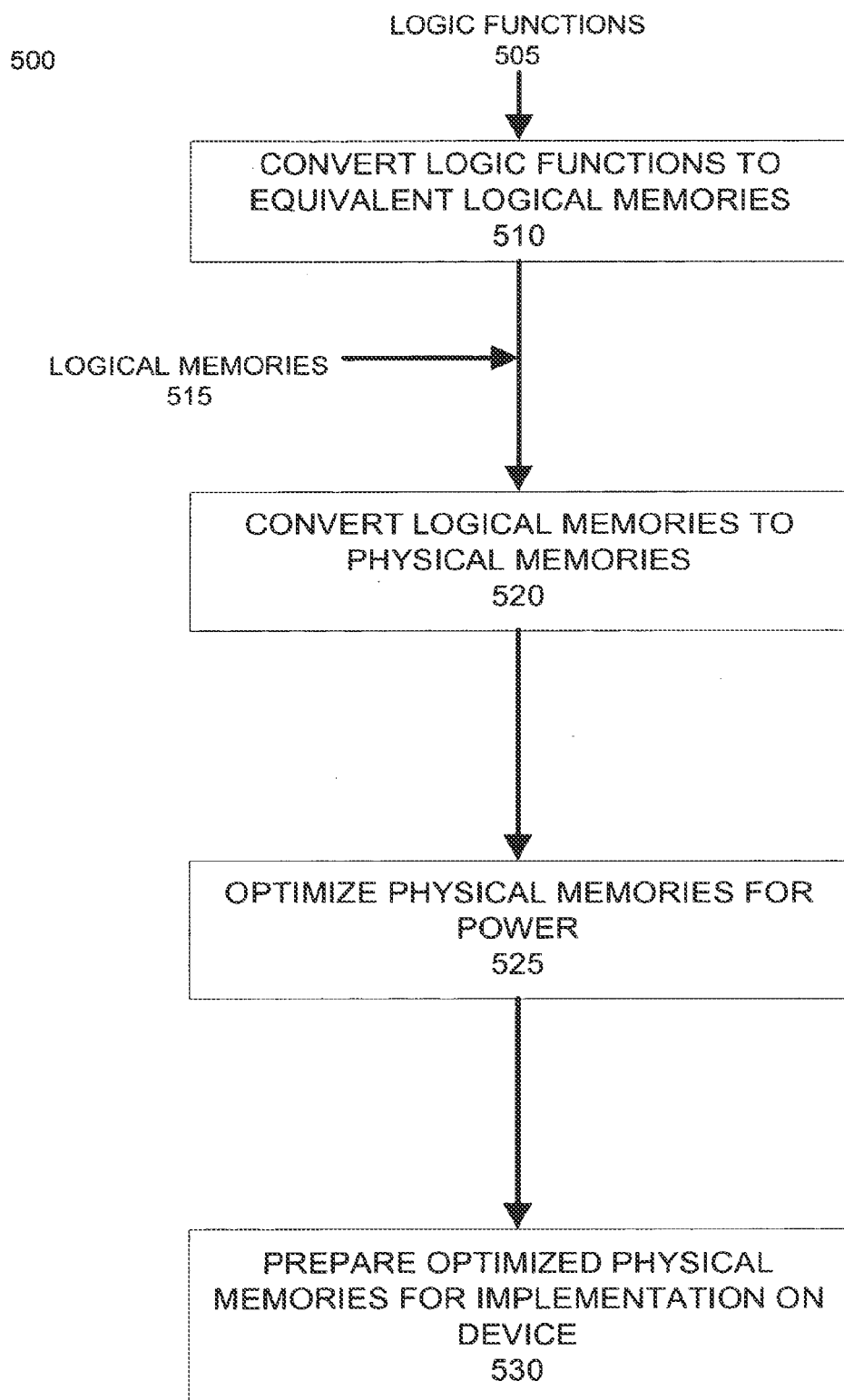
FIG. 5 illustrates a mapping flow for converting logical memory of a design into physical memory implemented by the programmable device according to an embodiment of the invention.
Figure 6:
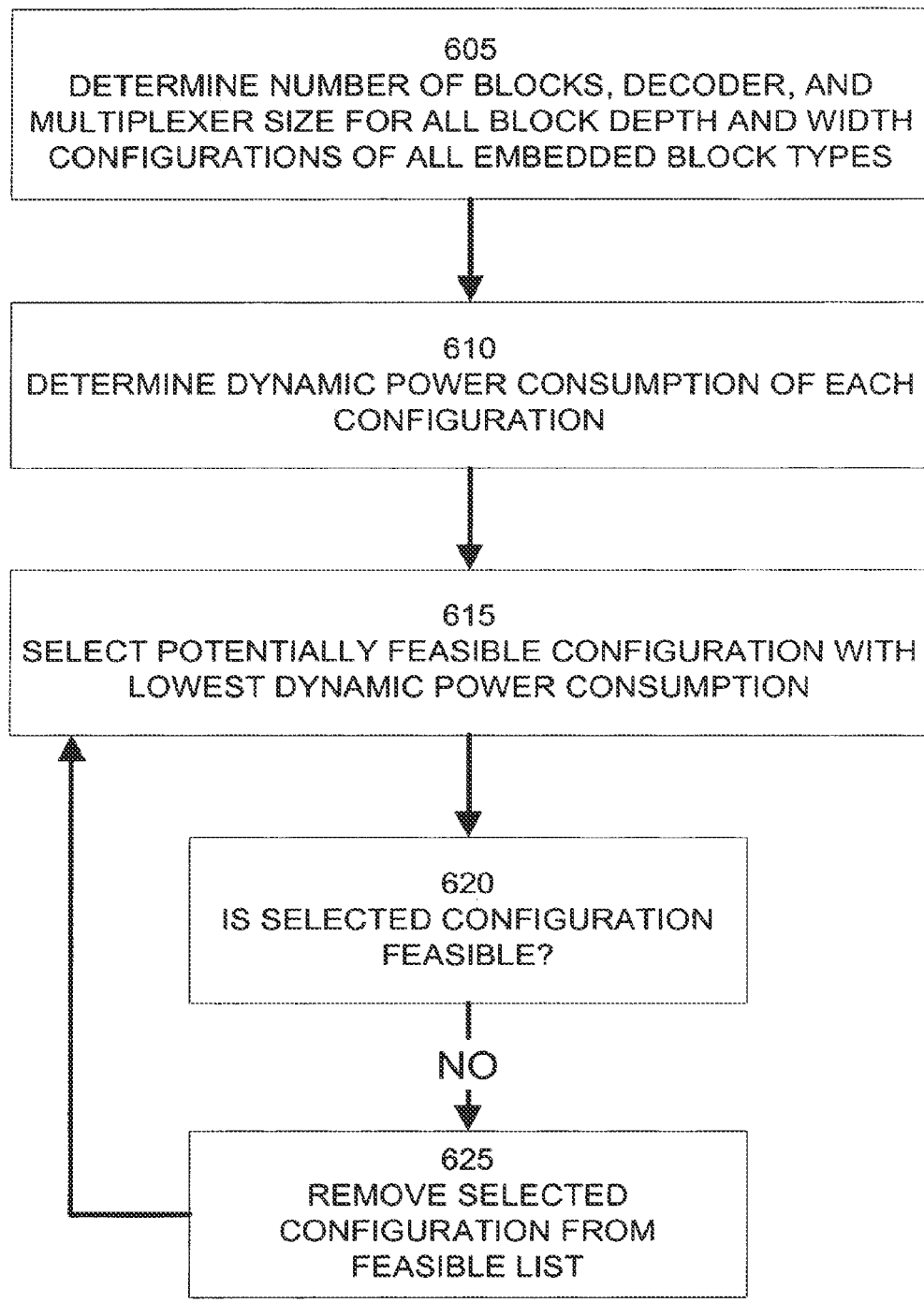
FIG. 6 illustrates a power balancing method according to an embodiment of the invention.

The power optimization approaches discussed above can be applied alone or together to determine a power optimized physical memory implementation of a logical memory. FIGS. 5 and 6 illustrate a mapping flow and power balancing method suitable for determining a physical memory implementation of a logical memory that is optimized for power consumption, timing, and area according to an embodiment of the invention. The mapping flow and power balancing method can utilize the above discussed optimizations as well as other power, timing, or area optimizations known in the art.

FIG. 5 illustrates a mapping flow 500 for converting logical memory and logic functions of a design into physical memory implemented by the programmable device according to an embodiment of the invention. Mapping flow 500 receives logic functions 505, such as RAM buffers, including FIFOs and LIFOs; shift registers, and other logic functions that can be implemented, at least in part, using physical memories. Phase 510 converts the logic functions 505 into equivalent logical memories and associated logic circuits, which can be implemented using programmable device resources.

Phase 520 may receive logical memory specifications corresponding with logic functions 505 from phase 510. Phase 520 may also receive specifications for logical memories 515 that are specified explicitly in the design.

Phase 520 converts logical memories into one or more physical memory configurations. For each logical memory specification, phase 520 determines one or more corresponding physical memory configurations. A programmable device can include memory blocks of numerous different sizes, bit widths, and depths. Some programmable devices can also include memory blocks that can be configured to several bit widths and depths. Some programmable devices can also include dual-use blocks. Dual-use blocks can be configured to implement either logic functions, thereby acting like a logic cell or group of logic cells, or memory functions, thereby acting like a memory block. Thus, embodiments of the invention can consider dual-use blocks as a type of memory block. In an embodiment, phase 520 determines a set of physical memories corresponding with the logical memories of the design that is capable of being implemented by the programmable device.

Phase 525 evaluates the power consumption of the physical memory configurations provided by phase 520 and selects the optimal configuration in view of timing, area, and other design constraints. FIG. 6 illustrates a power optimization method 600 that satisfies design constraints on timing and area according to an embodiment of the invention.

Step 605 determines the number of embedded memory blocks required for each physical memory configuration with the selected memory block type. Step 605 also determines the size of the address decoding logic and multiplexer required to support each physical memory configuration. In an embodiment, step 605 determines these attributes for each possible memory block width and depth supported by the memory block types.

Step 610 determines the total dynamic power consumption for each physical memory configuration. Step 610 determines the dynamic power consumption of the memory block(s) in the appropriate bit width and depth configuration. Step 610 then scales this power consumption by the total number of active memory blocks of each type during each memory access. Step 610 also determines the dynamic power consumption of supporting logic, such as address decoding logic and multiplexers. In an embodiment, step 610 determines the dynamic power consumption of a single bit of the output multiplexer, if any is present in the physical memory configuration, and scales this amount by the total number of multiplexer bits required. Step 610 also determines the dynamic power consumption of the address decoding logic, if any is present in the physical memory configuration. In an embodiment, this calculation is repeated for each active memory access port in the physical memory configuration.

Step 610 sums the dynamic power consumption from active memory blocks and supporting logic from each active memory port to determine the total dynamic power consumption of a physical memory configuration. Step 610 is repeated for each physical memory configuration. In a further embodiment, if the physical memory corresponds with a logical memory used to implement a logic function, such as a shift register, counter, or buffer, step 610 also includes the power consumption from any additional supporting logic in the total dynamic power consumption. The physical memory configurations and their respective dynamic power consumption values are stored in a list of potentially feasible implementations of the logical memory.

Step 615 ranks the physical memory configurations according to their respective dynamic power consumptions and selects the physical memory configuration with the lowest power consumption.

Step 620 evaluates the feasibility of the selected physical memory configuration. In an embodiment, step 620 determines if the selected physical memory configuration does not require more memory blocks than available in the programmable device. The amount of memory blocks of each type available in the programmable device is limited, at the least, by the architecture of the programmable device. This amount may be further limited by memory blocks already allocated to implement other portions of the design, such as other logical memories or logic functions. For programmable devices with dual-use blocks, some or all of the dual-use blocks may also be required to implement logic functions, and be unavailable for use as memory blocks. Finally, user floorplan constraints may restrict some logical memories to portions of the device, and consequently the physical memory configurations used to implement these logical memories must not use more memory blocks of each type than are available in the appropriate portion of the device.

In a further embodiment of step 620, timing analysis information, if timing analysis has already been performed, or timing estimate information can be used to determine whether the selected physical memory configuration violates any timing constraints. Similarly, an embodiment of step 620 can use synthesis information or estimates to determine whether the selected physical memory configuration, and in particular its associated logic, violates any area or logic element usage constraints.

If step 620 determines the selected physical memory configuration is not feasible due to memory block usage, timing constraints, area constraints, or any other factor, step 625 removes the selected physical memory configuration from the list of potentially feasible implementations. Method 600 then returns to step 615 and 620 to select and evaluate another physical memory configuration.

In contrast, if step 620 determines that the selected physical memory configuration is feasible, the selected physical memory configuration is stored for further processing. In an embodiment, method 600 is repeated for each logical memory in the design, so that a power optimized and feasible physical memory configuration is chosen for each logical memory.

Returning to flow 500, phase 525 outputs a set of power-optimized physical memory configurations corresponding with the logical memories. Following the optimization of the physical memories in phase 525, phase 530 prepares the optimized physical memories for implementation by the programmable device. For example, phase 530 may add and configure the multiplexers, address decoding logic and clock enable generation logic as needed for each optimized physical memory configuration.

In some applications, there may be interactions between the physical mapping of various logical memories. For example, a power-optimized physical mapping of a first logical memory in a design may make a physical mapping of a second logical memory infeasible due to the limitations of the programmable device, such as the number of available physical memory blocks or timing and routing constraints.

To deal with these interactions, an embodiment sorts logical memories by their expected power consumption and phase 525 determines physical mappings for the highest power logical memories first. This provides greater implementation flexibility for the logical memories expected to require the most power.

A further embodiment can iterate through phases 520 and 525 several times, with any logical memory that had no feasible physical memory configuration in a previous iteration moved to the front of the list of logical memories to process in later iterations. Successive iterations of phase 520 may determine alternative physical memory implementations of one or more of the logical memories in an attempt to create a feasible and power-optimized set of physical memories.

Figure 7:
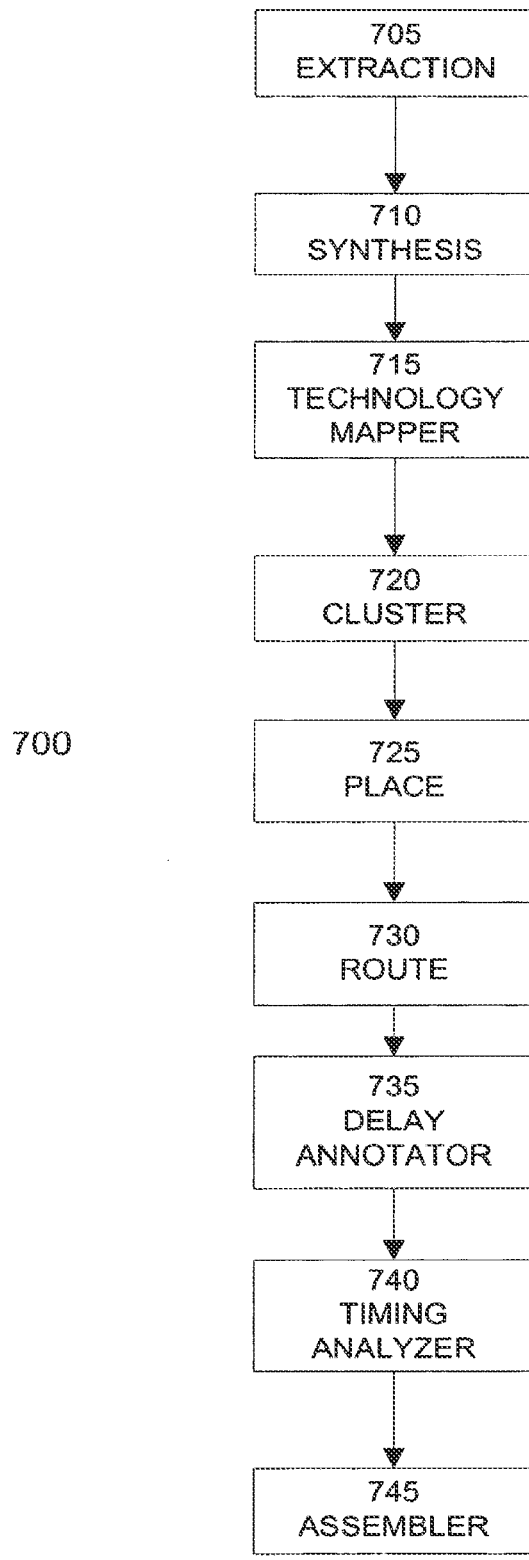
FIG. 7 illustrates the phases of a typical compilation process suitable for implementing an embodiment of the invention.

FIG. 7 illustrates the phases of a typical compilation process 700 suitable for implementing an embodiment of the invention. The compilation process 700 converts a user design into a programmable device configuration adapted to configure a programmable device to implement the user design. The extraction phase 705 converts a description of the user design, expressed for example in a hardware description language, into a register transfer level description.

Synthesis phase 710 converts the register transfer layer description of the user design into a set of logic gates. Technology mapping phase 715 subdivides the set of logic gates into a set of atoms, which are groups of logic gates matching the capabilities of the logic cells or other functional blocks of the programmable device. A given user design may be converted into any number of different sets of atoms, depending upon the underlying hardware of the programmable device used to implement the user design.

Following the technology mapping phase 715, the cluster phase 720 groups related atoms together into clusters. The place phase 725 assigns clusters of atoms to locations on the programmable device. The route phase 730 determines the configuration of the configurable switching circuit of the programmable device used to connect the atoms implementing the user design.

The delay annotator phase 735 determines the signal delays for the set of atoms and their associated connections in the configurable switching circuit using a timing model of the programmable device. The timing analysis phase 740 determines the maximum operating speed of the programmable device when implementing the user design, for example by determining the portions of the user design have the largest signal delay.

The assembler phase 745 generates a set of configuration information specifying the configuration of the programmable device implementing the user design, including the configuration of each of the logic cells used to implement the user design and the configuration of the configurable switching circuit used to connect the logic cells. The assembler phase 745 can write the configuration information to a configuration file, which can then be used to configure one or more programmable devices to implement instances of the user design.

In an embodiment, the mapping flow 500 and method 600 are integrated into compilation process 700. In a some embodiments, the mapping flow 500 and method 600 are performed early in the compilation process 700, such as in conjunction with the synthesis 710 or technology mapping phase 715. As a result, the mapping flow 500 and method 600 may have to rely on estimated timing and area information. In some circumstances, this estimated information may not be accurate and the timing or area constraints of a design may be exceeded by the power-optimized physical memory configurations selected earlier in the compilation process.

An embodiment of the invention addresses this possibility by adding an iteration loop to compilation process 700. When a timing or area constraint is violated by a path in the design that includes a power-optimized physical memory configuration, an embodiment of the compilation process checks on the amount of logic cells or other programmable device resources and/or the amount of timing delay that was added by the power optimization of the physical memory configuration. In a further embodiment, this information is determined at the time the power-optimization is performed and stored for later reference. If the amount of logic cells or timing delay introduced by the power optimization contributes substantially to the path's constraint violations, an embodiment of the compilation process 700 repeats all or a portion of the phases of the compilation process 700 with power optimization disabled for the offending physical memory configuration.

Figure 8:
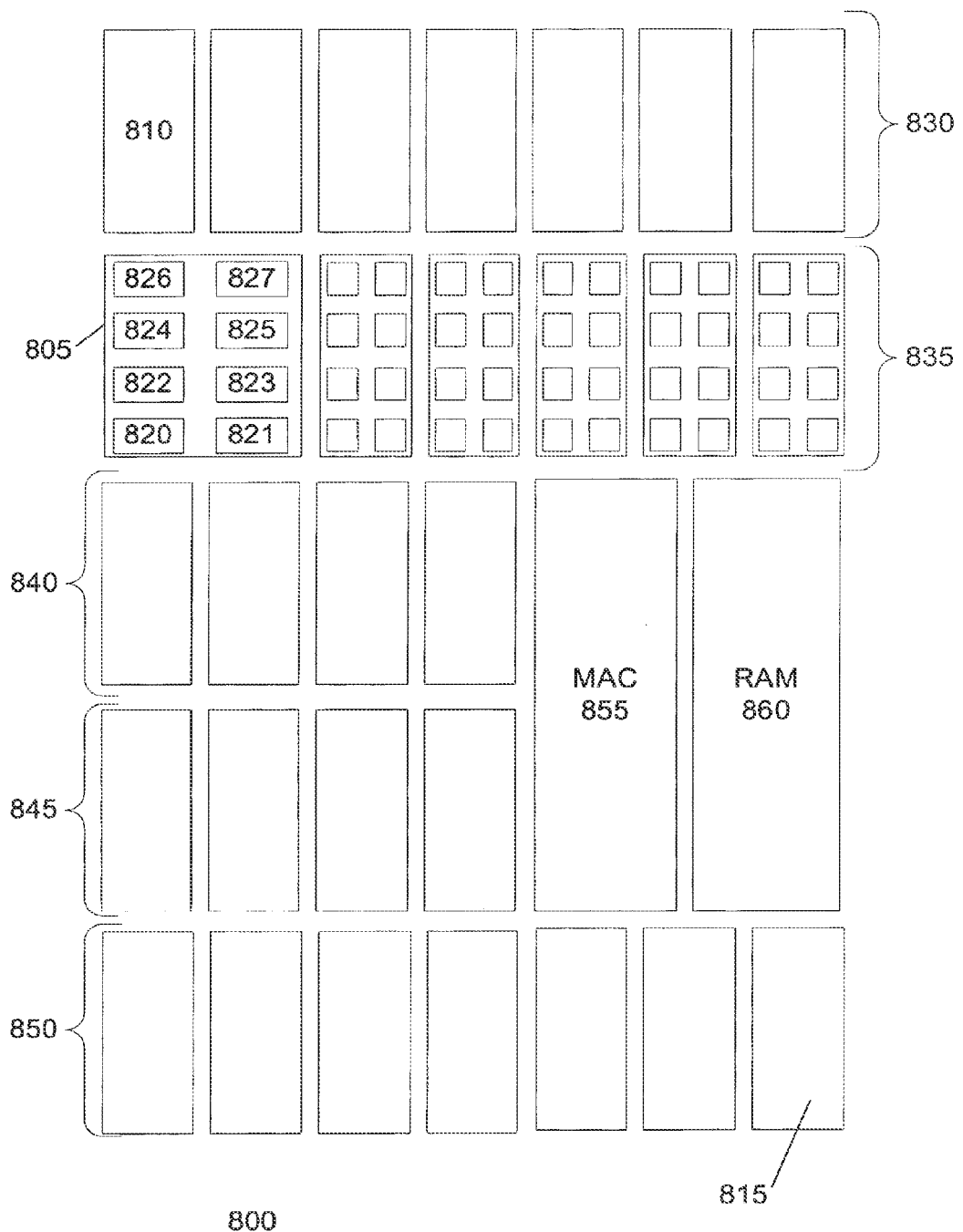
FIG. 8 illustrates a portion of an example programmable device suitable for use with an embodiment of the invention.

FIG. 8 illustrates a portion of an example programmable device 800 suitable for use with an embodiment of the invention. Programmable device 800 includes a number of logic array blocks (LABs), such as LABs 805, 810, 815. Each LAB includes a number of programmable logic cells using logic gates and/or look-up tables to perform a logic operation. LAB 805 illustrates in detail logic cells 820, 821, 822, 823, 824, 825, 826, and 827. Logic cells are omitted from other LABs in FIG. 8 for clarity. The LABs of device 800 are arranged into rows 830, 835, 840, 845, and 850.

In an embodiment, the arrangement of logic cells within a LAB and of LABs within rows provides a hierarchical system of configurable connections, in which connections between logic cells within a LAB, between cells in different LABs in the same row, and between cell in LABs in different rows require progressively more resources and operate less efficiently. In some programmable devices, such as field programmable gate arrays (FPGAs), the configurable connections are implemented with a configurable switching circuit capable of routing signals between any arbitrary portions of the programmable device in accordance with configuration data. The operation of the configurable switching circuit can be specified at any time by loading a programmable device configuration into the programmable device. In other programmable devices, such as structured ASICs, the configurable connections are specified during manufacturing according to the configuration data produced by a compilation process 700.

In addition to logic cells arranged in LABs, programmable device 800 also include specialized functional blocks, such as multiply and accumulate block (MAC) 855 and random access memory block (RAM) 860. For clarity, the portion of the programmable device 800 shown in FIG. 8 only includes a small number of logic cells, LABs, and functional blocks. Typical programmable devices will include thousands or tens of thousands of these elements.

Figure 9:
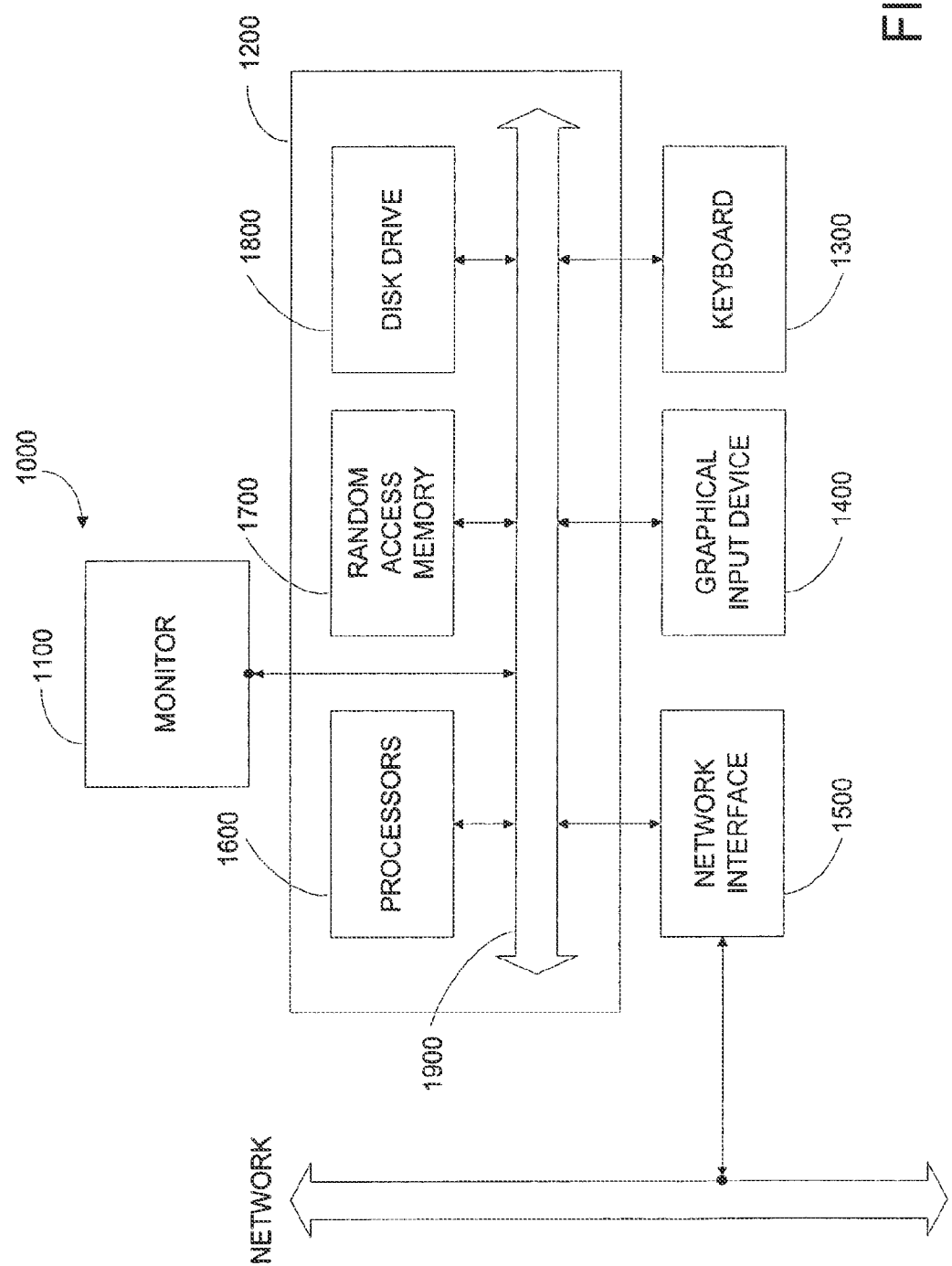
FIG. 9 illustrates a computer system suitable for implementing an embodiment of the invention.

FIG. 9 illustrates a computer system 1000 suitable for implementing an embodiment of the invention. Computer system 1000 typically includes a monitor 1100, computer 1200, a keyboard 1300, a user input device 1400, and a network interface 1500. User input device 1400 includes a computer mouse, a trackball, a track pad, graphics tablet, touch screen, and/or other wired or wireless input devices that allow a user to create or select graphics, objects, icons, and/or text appearing on the monitor 1100. Embodiments of network interface 1500 typically provides wired or wireless communication with an electronic communications network, such as a local area network, a wide area network, for example the Internet, and/or virtual networks, for example a virtual private network (VPN).

Computer 1200 typically includes components such as one or more general purpose processors 1600, and memory storage devices, such as a random access memory (RAM) 1700, disk drives 1800, and system bus 1900 interconnecting the above components. RAM 1700 and disk drive 1800 are examples of tangible media for storage of data, audio/video files, computer programs, applet interpreters or compilers, virtual machines, and embodiments of the herein described invention. Further embodiments of computer 1200 can include specialized input, output, and communications subsystems for configuring, operating, testing, and communicating with programmable devices. Other types of tangible media include floppy disks; removable hard disks; optical storage media such as DVD-ROM, CD-ROM, and bar codes; non-volatile memory devices such as flash memories; read-only-memories (ROMS); battery-backed volatile memories; and networked storage devices.

Further embodiments can be envisioned to one of ordinary skill in the art after reading the attached documents. For example, although the invention has been discussed with reference to programmable devices, it is equally applicable to logic minimization applications used to design any type of digital device, such as standard or structured ASICs, gate arrays, general digital logic devices, as well as digital logic devices implemented with advanced process technologies such as silicon nanowires or carbon nanotubes. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method for memory access in a programmable logic device, the method comprising:
   receiving a logical memory block configuration layout;
   identifying, based on the logical memory block configuration layout, at least two potential mappings of a plurality of embedded memory blocks from the programmable logic device, wherein:
      the plurality of embedded memory blocks is coupled to a plurality of memory ports, and
      the plurality of memory ports is enabled by a common clock signal;
   selecting one of the at least two potential mappings based on power consumption of each potential mapping, wherein the power consumption of each potential mapping is determined based on determining a number of embedded memory blocks, a number of ports in the plurality of memory ports that are associated with the potential mapping, and a size of associated logic circuits, and the power consumption of the selected potential mapping is less than the power consumption of at least one unselected potential mapping;
   implementing the logical memory block configuration layout using the selected potential mapping; and
   disabling a first memory port from the plurality of memory ports in response to a determination that the first memory port is unused in the implementation.

2. The method of claim 1, wherein the identifying is performed in response to a total power consumption of the plurality of embedded memory blocks.

3. The method of claim 1, wherein the disabling of the first memory port further comprises disabling a bit line precharge unit coupled to the first memory port.

4. The method of claim 1, wherein the disabling of the first memory port further comprises disabling a sense amplifier coupled to the first memory port.

5. The method of claim 1, wherein the logical memory block configuration layout comprises a logical memory bit width and a logical memory bit depth.

6. The method of claim 1, further comprising:
   selectively enabling a second memory port from the plurality of memory ports in response to a determination that the second memory port is selectively used in the implementation.

7. The method of claim 6, wherein selectively enabling the second memory port comprises:
   setting a read enable input to a logical-high value, wherein the read enable input is coupled to a latch; and
   generating a modified read clock enable signal as an output of a logical-AND operation between a read clock enable signal and a read enable signal.

8. The method of claim 1, wherein the disabling of the first memory port comprises:
   generating a modified clock signal as an output of a logical AND operation between a logical low signal and the common clock signal; and
   clocking the first memory port using the modified clock signal to selectively deactivate a bitline precharge unit connected to a first embedded memory block in the plurality of embedded memory blocks.

9. An integrated circuit, the integrated circuit comprising:
   configuration circuitry, the configuration circuitry operable to:
      receive a logical memory block configuration layout;
      identify, based on the logical memory block configuration layout, at least two potential mappings of a plurality of embedded memory blocks from the integrated circuit, wherein:
         the plurality of embedded memory blocks coupled to a plurality of memory ports, and
         the plurality of memory ports is enabled by a common clock signal; and
      select one of the at least two potential mappings based on power consumption of each potential mapping, wherein the power consumption of each potential mapping is determined based on determining a number of embedded memory blocks, a number of ports in the plurality of memory ports that are associated with the potential mapping, and an amount of associated logic circuits, and the power consumption of the selected potential mapping is less than the power consumption of at least one unselected potential mapping;
      implement the logical memory block configuration layout using the selected potential mapping; and
   power control circuitry, the power control circuitry operable to disable a first memory port from the plurality of memory ports.

10. The integrated circuit of claim 9, wherein the configuration circuitry is further configured to perform the identifying in response to a total power consumption of the plurality of embedded memory blocks.

11. The integrated circuit of claim 9, wherein the power control circuitry is further configured to disable the first memory port by disabling a bit line precharge unit coupled to the first memory port.

12. The integrated circuit of claim 9, wherein the power control circuitry is further configured to disable the first memory port by disabling a sense amplifier coupled to the first memory port.

13. The integrated circuit of claim 9, wherein the configuration circuitry is further configured to perform the identifying in response to one or more timing estimates associated with the plurality of embedded memory blocks.

14. The integrated circuit of claim 9, wherein the power control circuitry is further operable to selectively enable a second memory port from the plurality of memory ports in response to a determination that the second memory port is selectively used in the implementation.

15. The integrated circuit of claim 14, wherein the power control circuitry is further configured to selectively enable the second memory port by:
   setting a read enable input to a logical-high value, wherein the read enable input is coupled to a latch; and
   generating a modified read clock enable signal as an output of a logical-AND operation between a read clock enable signal and a read enable signal.

16. The integrated circuit of claim 9, wherein the power control circuitry is operable to disable the first memory port by:
   generating a modified clock signal as an output of a logical AND operation between a logical low signal and the common clock signal; and
   clocking the first memory port using the modified clock signal to selectively deactivate a bitline precharge unit connected to a first embedded memory block in the plurality of embedded memory blocks.

17. An integrated circuit, the integrated circuit comprising:
   configuration circuitry, the configuration circuitry operable to:

receive a logical memory block configuration layout;
identify at least two potential mappings of a plurality of embedded memory blocks from the integrated circuit, the plurality of embedded memory blocks coupled to a plurality of memory ports, based on the received logical memory block configuration layout associated with the plurality of embedded memory blocks; and
select one of the at least two potential mappings based on power consumption of each potential mapping, wherein the power consumption of each potential mapping is determined based on determining a number of embedded memory blocks, a number of ports in the plurality of memory ports that are associated with the potential mapping, and an amount of associated logic circuits, and the power consumption of the selected potential mapping is less than the power consumption of at least one unselected potential mapping;
implement the logical memory block configuration layout using the selected potential mapping; and
power control circuitry, the power control circuitry operable to selectively enable a memory port from the plurality of memory ports.

18. The integrated circuit of claim 17, wherein the configuration circuitry is further configured to perform the identifying in response to a total power consumption of the plurality of embedded memory blocks.

19. The integrated circuit of claim 17, wherein the configuration circuitry is further configured to perform the identifying in response to one or more timing estimates associated with the plurality of embedded memory blocks.

20. The integrated circuit of claim 17, wherein the logical memory block configuration layout comprises a logical memory bit width and a logical memory bit depth.

21. The integrated circuit of claim 17, wherein the power control circuitry is operable to enable the memory port by:
setting an enable signal to a logical high value, wherein the enable signal is coupled to a latch;
generating a modified clock signal as an output of a logical AND operation between the enable signal and a clock signal; and
clocking the memory port using the modified clock signal to selectively activate a bitline precharge unit connected to a first embedded memory block in the number of embedded memory blocks.

\* \* \* \* \*